US010651222B2

(12) United States Patent
Kato et al.

(10) Patent No.: US 10,651,222 B2
(45) Date of Patent: May 12, 2020

(54) SOLID-STATE IMAGING DEVICE AND ELECTRONIC APPARATUS

(71) Applicant: SONY CORPORATION, Tokyo (JP)

(72) Inventors: Nanako Kato, Kanagawa (JP); Toshifumi Wakano, Kanagawa (JP); Yusuke Otake, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/084,602

(22) PCT Filed: Jan. 18, 2017

(86) PCT No.: PCT/JP2017/001581
§ 371 (c)(1),
(2) Date: Sep. 13, 2018

(87) PCT Pub. No.: WO2017/163559
PCT Pub. Date: Sep. 28, 2017

(65) Prior Publication Data
US 2019/0088693 A1 Mar. 21, 2019

(30) Foreign Application Priority Data
Mar. 23, 2016 (JP) .................... 2016-058443

(51) Int. Cl.
*H01L 27/14* (2006.01)
*H01L 27/146* (2006.01)
(Continued)

(52) U.S. Cl.
CPC ...... *H01L 27/1463* (2013.01); *H01L 27/1461* (2013.01); *H01L 27/14625* (2013.01);
(Continued)

(58) Field of Classification Search
CPC .......................... H01L 31/18; H01L 31/0352
See application file for complete search history.

(56) References Cited

U.S. PATENT DOCUMENTS 5,453,611 A    9/1995  Oozu et al.
2006/0174824 A1    8/2006  Hiramoto
(Continued)

FOREIGN PATENT DOCUMENTS

CN    101853865 A    10/2010
CN    102194843 A    9/2011
(Continued)

OTHER PUBLICATIONS

International Search Report and Written Opinion of PCT Application No. PCT/JP2017/001581, dated Feb. 28, 2017, 09 pages of ISRWO.

*Primary Examiner* — Fernando L Toledo
*Assistant Examiner* — Valerie N Newton
(74) *Attorney, Agent, or Firm* — Chip Law Group

(57) ABSTRACT

A solid-state imaging device according to the present disclosure includes: a photoelectric conversion film that is provided outside a semiconductor substrate on a pixel-by-pixel basis, performs photoelectric conversion on light having a predetermined wavelength range, and transmits light having wavelength ranges other than the predetermined wavelength range; and a photoelectric conversion region that is provided inside the semiconductor substrate on a pixel-by-pixel basis and performs photoelectric conversion on the light having the wavelength ranges, the light having the wavelength ranges having passed through the photoelectric conversion film. The photoelectric conversion film includes a film having an avalanche function.

20 Claims, 10 Drawing Sheets

(51) Int. Cl.
  *H01L 31/107* (2006.01)
  *H01L 27/30* (2006.01)
(52) U.S. Cl.
  CPC .. *H01L 27/14645* (2013.01); *H01L 27/14667* (2013.01); *H01L 27/14687* (2013.01); *H01L 27/307* (2013.01); *H01L 31/107* (2013.01); *H01L 27/1464* (2013.01); *H01L 27/14621* (2013.01); *H01L 27/14627* (2013.01); *H01L 27/14638* (2013.01)

(56) References Cited

U.S. PATENT DOCUMENTS

| | | |
|---|---|---|
| 2010/0187501 A1 | 7/2010 | Toda |
| 2011/0227091 A1 | 9/2011 | Toda |
| 2013/0027593 A1 | 1/2013 | Enoki et al. |
| 2015/0187843 A1 | 7/2015 | Hatano et al. |

FOREIGN PATENT DOCUMENTS

| | | |
|---|---|---|
| CN | 102903852 A | 1/2013 |
| EP | 0605898 A1 | 7/1994 |
| EP | 1608028 A1 | 12/2005 |
| JP | 06-204445 A | 7/1994 |
| JP | 07-169931 A | 7/1995 |
| JP | 2004-288992 A | 10/2004 |
| JP | 2006-245284 A | 9/2006 |
| JP | 2010-177392 A | 8/2010 |
| JP | 2011-199057 A | 10/2011 |
| JP | 2012-238648 A | 12/2012 |
| JP | 2013-030592 A | 2/2013 |
| KR | 10-1997-0011763 B1 | 7/1997 |
| KR | 10-2010-0088077 A | 8/2010 |
| KR | 10-2011-0105711 A | 9/2011 |
| TW | 201042756 A | 12/2010 |
| TW | 201140817 A | 11/2011 |
| WO | 2004/086518 A1 | 10/2004 |
| WO | 2014/027588 A1 | 2/2014 |

SOLID-STATE IMAGING DEVICE AND ELECTRONIC APPARATUS

CROSS REFERENCE TO RELATED APPLICATIONS

This application is a U.S. National Phase of International Patent Application No. PCT/JP2017/001581 filed on Jan. 18, 2017, which claims priority benefit of Japanese Patent Application No. JP 2016-058443 filed in the Japan Patent Office on Mar. 23, 2016. Each of the above-referenced applications is hereby incorporated herein by reference in its entirety.

TECHNICAL FIELD

The present disclosure relates to a solid-state imaging device and an electronic apparatus.

BACKGROUND ART

There is a solid-state imaging device having a so-called lamination-type pixel structure in which a photoelectric conversion film that performs photoelectric conversion on light having a predetermined wavelength range is provided outside a semiconductor substrate, whereas a photoelectric conversion region that performs photoelectric conversion on light having wavelength ranges other than the predetermined wavelength range is provided inside the semiconductor substrate, the light having wavelength ranges having passed through the photoelectric conversion film (see, e.g., Patent Literature 1).

According to the lamination-type pixel structure, a photoelectric conversion unit (photoelectric conversion film and photoelectric conversion region) having sensitivity to two or more colors can be disposed within a region of one pixel. Thus, as compared with a case where the photoelectric conversion unit having sensitivity to two or more colors is disposed on a plane, the lamination-type pixel structure has an advantage that a reduction in size of the chip area of the solid-state imaging device can be achieved.

CITATION LIST

Patent Literature

Patent Literature 1: Japanese Patent Application Laid-open No. 2012-238648

DISCLOSURE OF INVENTION

Technical Problem

By the way, in the solid-state imaging device, when the number of pixels is increased so as to achieve high definition and high image quality of a captured image, and the pixel size decreases accordingly, a maximum charge amount to be handled per pixel or sensitivity is reduced, and the image quality is thus deteriorated. A problem of the reduction in sensitivity due to the increase in number of pixels also applies to a solid-state imaging device having a lamination-type pixel structure.

In this regard, it is an object of the present disclosure to provide a solid-state imaging device capable of improving sensitivity in a lamination-type pixel structure including a photoelectric conversion film, and an electronic apparatus including the solid-state imaging device.

Solution to Problem

A solid-state imaging device of the present disclosure for achieving the object described above includes: a photoelectric conversion film that is provided outside a semiconductor substrate on a pixel-by-pixel basis, performs photoelectric conversion on light having a predetermined wavelength range, and transmits light having wavelength ranges other than the predetermined wavelength range; and a photoelectric conversion region that is provided inside the semiconductor substrate on a pixel-by-pixel basis and performs photoelectric conversion on the light having the wavelength ranges, the light having the wavelength ranges having passed through the photoelectric conversion film, the photoelectric conversion film including a film having an avalanche function. Further, an electronic apparatus of the present disclosure for achieving the object described above includes a solid-state imaging device having the configuration described above.

A pixel structure in the solid-state imaging device of the present disclosure is a structure in which a photoelectric conversion film is provided outside a semiconductor substrate, a photoelectric conversion region is provided inside the semiconductor substrate, and the photoelectric conversion film and the photoelectric conversion region that are a photoelectric conversion unit are laminated in an optical axis direction of incident light (structure in which the photoelectric conversion unit is sterically disposed). In this lamination-type pixel structure, the photoelectric conversion film is formed of a film having an avalanche function, and thus the number of electrons to be generated by photoelectric conversion per pixel can be increased by an avalanche effect. Additionally, assuming that a pixel that uses a film having an avalanche function as a photoelectric conversion film and a pixel that does not use the film obtain the same output level under the same amount of incident light, the pixel that uses the film having an avalanche function can be reduced in size more than pixel that does not use the film.

Advantageous Effects of Invention

According to the present disclosure, since sensitivity can be improved by using a film having an avalanche function as a photoelectric conversion film, it is possible to achieve a reduction in size of the chip area in a solid-state imaging device having a lamination-type pixel structure.

It should be noted that the present disclosure is not necessarily limited to have the effects described herein, and any one of the effects described herein may be produced. Further, the effects described herein are merely examples and are not restrictive, and additional effects may be produced.

MODE(S) FOR CARRYING OUT THE INVENTION

Figure 1:
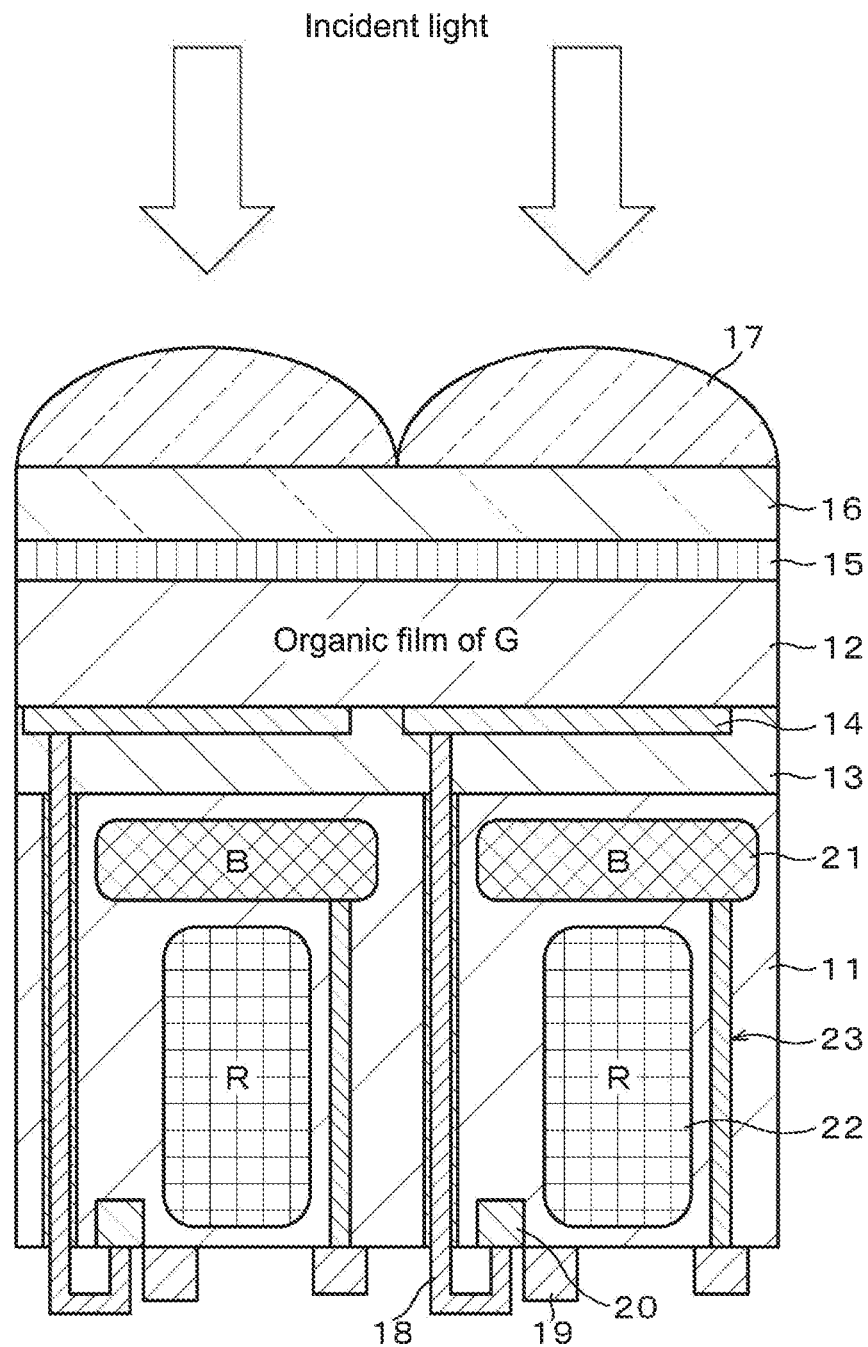
FIG. 1 is a cross-sectional view of a solid-state imaging device according to Embodiment 1 of the present disclosure.

Hereinafter, embodiments for carrying out the technology of the present disclosure will be described in detail with reference to the drawings. The technology of the present disclosure is not limited to the embodiments, and various numerical values, materials, and the like in the embodiments are examples. In the following description, the same elements or elements having the same function are denoted by the same symbols, and overlapping description will be omitted. It should be noted that the description will be given in the following order.
1. Overall description regarding solid-state imaging device and electronic apparatus of present disclosure
2. Solid-state imaging device according to one embodiment of present disclosure
  2-1. Embodiment 1 (Example in which photoelectric conversion film is formed of organic film in laminated structure corresponding to three colors)
  2-2. Embodiment 2 (Example in which photoelectric conversion film is formed of inorganic film in laminated structure corresponding to three colors)
  2-3. Embodiment 3 (Example in which photoelectric conversion film is formed of charge accumulation film in laminated structure corresponding to three colors)
  2-4. Embodiment 4 (Example in which photoelectric conversion film is formed of two layers of organic films in laminated structure corresponding to three colors)
  2-5. Embodiment 5 (Example in which photoelectric conversion film is formed of two layers of inorganic films in laminated structure corresponding to three colors)
  2-6. Embodiment 6 (Example in which photoelectric conversion film is formed of organic film in laminated structure corresponding to two colors)
  2-7. Embodiment 7 (Example in which photoelectric conversion film is formed of inorganic film in laminated structure corresponding to two colors)
  2-8. Embodiment 8 (Example in which silicon substrate is used as avalanche photodiode)
  2-9. Embodiment 9 (Another example of Embodiment 6 and Embodiment 7 employing laminated structure corresponding to two colors)
3. Modified example
4. Electronic apparatus (Example of imaging apparatus)
  <Overall Description Regarding Solid-State Imaging Device and Electronic Apparatus of Present Disclosure>

In a solid-state imaging device and an electronic apparatus of the present disclosure, a photoelectric conversion film can be an organic film formed of an organic material or can be an inorganic film formed of an inorganic material. Further, the photoelectric conversion film formed of an organic material or an inorganic material can have a function of accumulating charge.

Alternatively, in the solid-state imaging device and the electronic apparatus of the present disclosure including the favorable configuration described above, the photoelectric conversion film can include laminated photoelectric conversion films corresponding to two colors, and each of the photoelectric conversion films corresponding to the two colors can be formed of the film having the avalanche function. Further, each of the photoelectric conversion films corresponding to the two colors can be an organic film formed of an organic material, or can be an inorganic film formed of an inorganic material. Further, in the photoelectric conversion films corresponding to the two colors, the photoelectric conversion film on an incident light side can perform photoelectric conversion on blue light, and the photoelectric conversion film on the semiconductor substrate side can perform photoelectric conversion on green light. The photoelectric conversion region provided inside the semiconductor substrate can perform photoelectric conversion on red light.

Alternatively, in the solid-state imaging device and the electronic apparatus of the present disclosure including the favorable configuration described above, the photoelectric conversion region can be provided inside the semiconductor substrate and correspond to at least one color, and a color filter can be mounted on an incident light side of the photoelectric conversion film provided outside the semiconductor substrate. At that time, the color filter can include a complementary color filter.

<Solid-State Imaging Device According to One Embodiment of Present Disclosure>

The solid-state imaging device according to one embodiment of the present disclosure is, for example, a CMOS (Complementary Metal Oxide Semiconductor) image sensor as one type of X-Y address type solid-state imaging device. Here, the CMOS image sensor is an image sensor produced by applying or partially using a CMOS process. In the solid-state imaging device according to this embodiment, a pixel (unit pixel) including a photoelectric conversion unit (photoelectric conversion element) that photoelectrically converts incident light has a laminated structure in which the photoelectric conversion film and the photoelectric conversion region that are the photoelectric conversion unit are laminated in an in optical axis direction of the incident light.

In the pixel having such a laminated structure, the photoelectric conversion film is provided outside the semiconductor substrate on a pixel-by-pixel basis, performs photoelectric conversion on light having a green (G) wavelength range, and transmits light having wavelength ranges other than the green wavelength range. The photoelectric conversion regions are provided inside the semiconductor substrate on a pixel-by-pixel basis, for example, in a laminated state corresponding to two colors. Out of the photoelectric conversion regions corresponding to the two colors, a photoelectric conversion region positioned on the front surface side of the semiconductor substrate performs photoelectric conversion on light having a blue (B) wavelength range, in the light having the wavelength ranges that has passed through the green-light photoelectric conversion film, and transmits light having wavelength ranges other than the blue wavelength range. Further, a photoelectric conversion region positioned on the deep side of the semiconductor substrate performs photoelectric conversion on light having a red (R) wavelength range, in the light having the wavelength ranges that has passed through a blue-light photoelectric conversion region.

In this embodiment, the solid-state imaging device including the pixels that each have the above-mentioned laminated structure and are arrayed in a two-dimensional matrix is characterized in that the green-light photoelectric conversion film is formed of a film having an avalanche function. Examples of the photoelectric conversion film having an avalanche function include an avalanche film of Se (selenium), CIGS (thin-film substance made of a material of a compound including copper, indium, gallium, and selenium), or InGaAs (indium gallium arsenic).

Incidentally, an avalanche photodiode of silicon uses an avalanche effect, in which when a large reverse bias voltage (several tens to 200 V) is applied to a p-n junction of the semiconductor, carriers are generated in succession due to a movement of the small number of carriers, and a current increases at an accelerated rate. The avalanche film of Se, CIGS, InGaAs, or the like also uses the avalanche effect in a similar manner to the avalanche photodiode of silicon.

Since the photoelectric conversion film has the avalanche function in the pixel having the laminated structure, as compared with a case of a general photoelectric conversion film without the avalanche function, a pixel signal level that is obtained by photoelectric conversion of the photoelectric conversion film can be increased even with a small amount of incident light. Thus, an image with less feeling of noise can be obtained.

Here, assuming that, in the semiconductor substrate on which the pixels having the laminated structure are formed, a substrate surface on which a wiring layer is formed is a front surface, and the opposite surface thereof is a back surface, it is desirable that the pixel structure according to this embodiment is a backside illumination type pixel structure in which incident light is to be applied from the back surface side. In the backside illumination type pixel structure, a wiring layer does not intervene between the semiconductor substrate and the green-light photoelectric conversion film. Thus, as compared with a front-side illumination type pixel structure in which incident light is to be applied from the front surface side and the wiring layer intervenes, light can be efficiently taken in with respect to the blue-light photoelectric conversion region and a red-light photoelectric conversion region that are present inside the semiconductor substrate.

It should be noted that the technology of the present disclosure is not limited to the application to the backside illumination type pixel structure, and the application to the front-side illumination type pixel structure is not excluded. In other words, the technology of the present disclosure is also applicable to the front-side illumination type pixel structure.

Hereinafter, a solid-state imaging device according to one embodiment of the present disclosure, particularly, a specific embodiment of a pixel having a laminated structure will be described.

Embodiment 1

Embodiment 1 is an example in which a photoelectric conversion film is formed of an organic film in a laminated structure in which photoelectric conversion units corresponding to three colors are laminated in an optical axis direction of incident light. FIG. 1 shows a cross-sectional view of a solid-state imaging device according to Embodiment 1 of the present disclosure. FIG. 1 shows a cross-sectional structure corresponding to two pixels. The same holds true for Embodiment 2 to Embodiment 5 to be described later.

As shown in FIG. 1, the solid-state imaging device according to Embodiment 1 is characterized by using an organic film, which is formed of an organic material and has sensitivity mainly to the green wavelength range, as a green-light photoelectric conversion film 12 that is provided outside a silicon substrate 11 as an example of a semiconductor substrate. When the organic material is selected, the photoelectric conversion film 12 can be provided with high wavelength selectivity. The green-light photoelectric conversion film 12, which is formed of an organic film, is provided in common to all the pixels on the silicon substrate 11 via an insulating film 13.

On the lower surface side of the green-light photoelectric conversion film 12, lower electrodes 14 each formed of a transparent electrode are provided on a pixel-by-pixel basis. On the upper surface side of the green-light photoelectric conversion film 12, an upper electrode 15 formed of a transparent electrode is provided in common to all the pixels. A bias voltage is applied to the upper electrode 15 through wiring (not shown). Since the lower electrodes 14 are provided on a pixel-by-pixel basis, the green-light photoelectric conversion film 12 functions on a pixel-by-pixel basis to perform photoelectric conversion.

Here, in a case where the green-light photoelectric conversion film 12 is caused to function as a general photoelectric conversion film, a bias voltage of approximately several V is applied to the green-light photoelectric conversion film 12. In contrast to the above, in the solid-state imaging device according to Embodiment 1, a bias voltage of approximately several tens of V (a voltage that is to be a reverse bias) is applied to the green-light photoelectric conversion film 12. With this configuration, the green-light photoelectric conversion film 12 becomes a film having an avalanche function, in which carriers are generated in succession due to a movement of the small number of carriers, and a current increases at an accelerated rate (hereinafter, referred to as "avalanche film" in some cases).

It should be noted that the several tens of V, which has been exemplified as a bias voltage to be applied to impart the avalanche function to the green-light photoelectric conversion film 12, is an example, and the present disclosure is not limited thereto. A voltage that causes avalanche breakdown differs depending on the organic material forming the green-light photoelectric conversion film 12, and thus a bias voltage to be applied to the green-light photoelectric conversion film 12 is also determined depending on the material of the photoelectric conversion film 12.

The green-light photoelectric conversion film 12 has sensitivity mainly to the green wavelength range, and thus absorbs light having the green wavelength range, performs photoelectric conversion, and transmits light having wavelength ranges other than the green wavelength range. Charge obtained by the photoelectric conversion of the green-light photoelectric conversion film 12 is accumulated in a floating diffusion (FD) 20 from the lower electrode 14 through a wire 18 under the control of a gate portion 19. The floating diffusion (FD) 20 is formed on a surface (front surface) side opposite to the incident light side of the silicon substrate 11. The floating diffusion 20 is a charge-voltage conversion unit that converts the charge into a voltage. On the front surface of the silicon substrate 11, a wiring layer including the gate portion 19 (not shown) is to be formed.

On the upper electrode 15 of the green-light photoelectric conversion film 12, a lens (on-chip lens) 17 is provided on a pixel-by-pixel basis via a transparent insulating film 16. It should be noted that the lens 17 is not an indispensable constituent element. In other words, the lens 17 is not necessarily disposed. Further, the shape of the lens 17 is not particularly limited and is arbitrary.

Inside the silicon substrate 11, a blue-light photoelectric conversion region 21 and a red-light photoelectric conversion region 22 are formed as photoelectric conversion regions corresponding to two colors. Specifically, the blue-light photoelectric conversion region 21 is provided on the substrate surface side on the incident light side of the silicon substrate 11. The red-light photoelectric conversion region 22 is provided on the deep side of the silicon substrate 11. The blue-light photoelectric conversion region 21 and the red-light photoelectric conversion region 22 perform photoelectric conversion on the light having respective colors by using a difference in light absorption coefficient (wavelength dependence) of silicon (semiconductor).

The blue-light photoelectric conversion region 21 formed on the substrate surface side of the silicon substrate 11 absorbs light having the blue wavelength range that has a relatively short wavelength, in the light that has passed through the green-light photoelectric conversion film 12 and entered the silicon substrate 11, and performs photoelectric conversion thereon. Charge obtained by the photoelectric conversion of the blue-light photoelectric conversion region 21 is accumulated in a floating diffusion (not shown) through a vertical transistor 23, for example. The floating diffusion is formed on the substrate surface side opposite to the incident light side of the silicon substrate 11. Here, the vertical transistor 23 is used when the charge obtained in the blue-light photoelectric conversion region 21 is transferred to the wiring layer side (front surface side of the substrate), but the present disclosure is not limited thereto.

Further, the red-light photoelectric conversion region 22 formed on the deep side of the silicon substrate 11 absorbs light having the red wavelength range that has a relatively long wavelength, in the light that has passed through the blue-light photoelectric conversion region 21, and performs photoelectric conversion thereon. Charge obtained by the photoelectric conversion of the red-light photoelectric conversion region 22 is accumulated in a floating diffusion (not shown) formed inside the photoelectric conversion region 22 or on the surface side opposite to the incident light side of the silicon substrate 11.

As described above, the solid-state imaging device according to Embodiment 1 has the laminated structure corresponding to the three colors, in which the green-light photoelectric conversion film 12 outside the silicon substrate 11, and the blue-light photoelectric conversion region 21 and the red-light photoelectric conversion region 22 inside the silicon substrate 11 are laminated in the optical axis direction of the incident light.

It should be noted that this embodiment has exemplified the case where the green-light photoelectric conversion film 12 being as an avalanche film is formed of a single film layer, but this is also applicable to a case where the green-light photoelectric conversion film 12 is formed of a plurality of film layers. The same holds true for the following embodiments.

Embodiment 2

Figure 2:
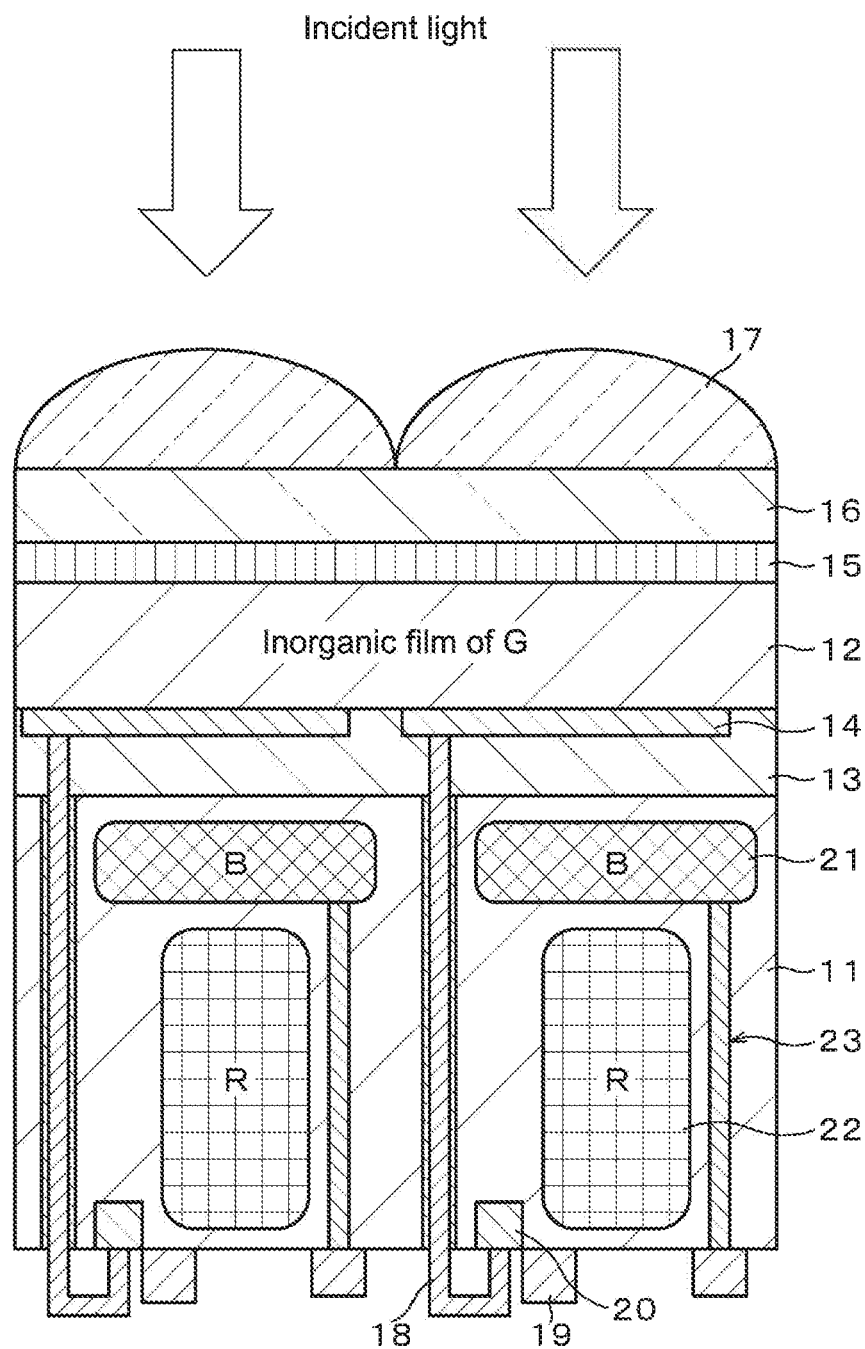
FIG. 2 is a cross-sectional view of a solid-state imaging device according to Embodiment 2 of the present disclosure.

Embodiment 2 is a modified example of Embodiment 1 and is an example in which the photoelectric conversion film is formed of an inorganic film in the laminated structure of the three colors in which the green-light photoelectric conversion film 12, the photoelectric conversion region 21, and the red-light photoelectric conversion region 22 are laminated in the optical axis direction of the incident light. FIG. 2 shows a cross-sectional view of a solid-state imaging device according to Embodiment 2 of the present disclosure.

As shown in FIG. 2, the solid-state imaging device according to Embodiment 2 is characterized by using an inorganic film, which is formed of an inorganic material and has sensitivity mainly to the green wavelength range, as the green-light photoelectric conversion film 12 that is provided outside the silicon substrate 11. Examples of the inorganic material of the green-light photoelectric conversion film 12 can include Se and CIGS, but the present disclosure is not limited thereto. The inorganic material has durability or heat resistance superior to the organic material and surpasses the organic material in terms of physical property values such as mobility and a breakdown voltage, depending on the material.

A bias voltage is applied also to the green-light photoelectric conversion film 12 formed of an inorganic film in order to impart an avalanche function thereto. This bias voltage is also determined depending on the material of the photoelectric conversion film 12, because a voltage that causes avalanche breakdown differs depending on the inorganic material as in the case of the green-light photoelectric conversion film 12 formed of the organic film of Embodiment 1.

Embodiment 3

Figure 3:
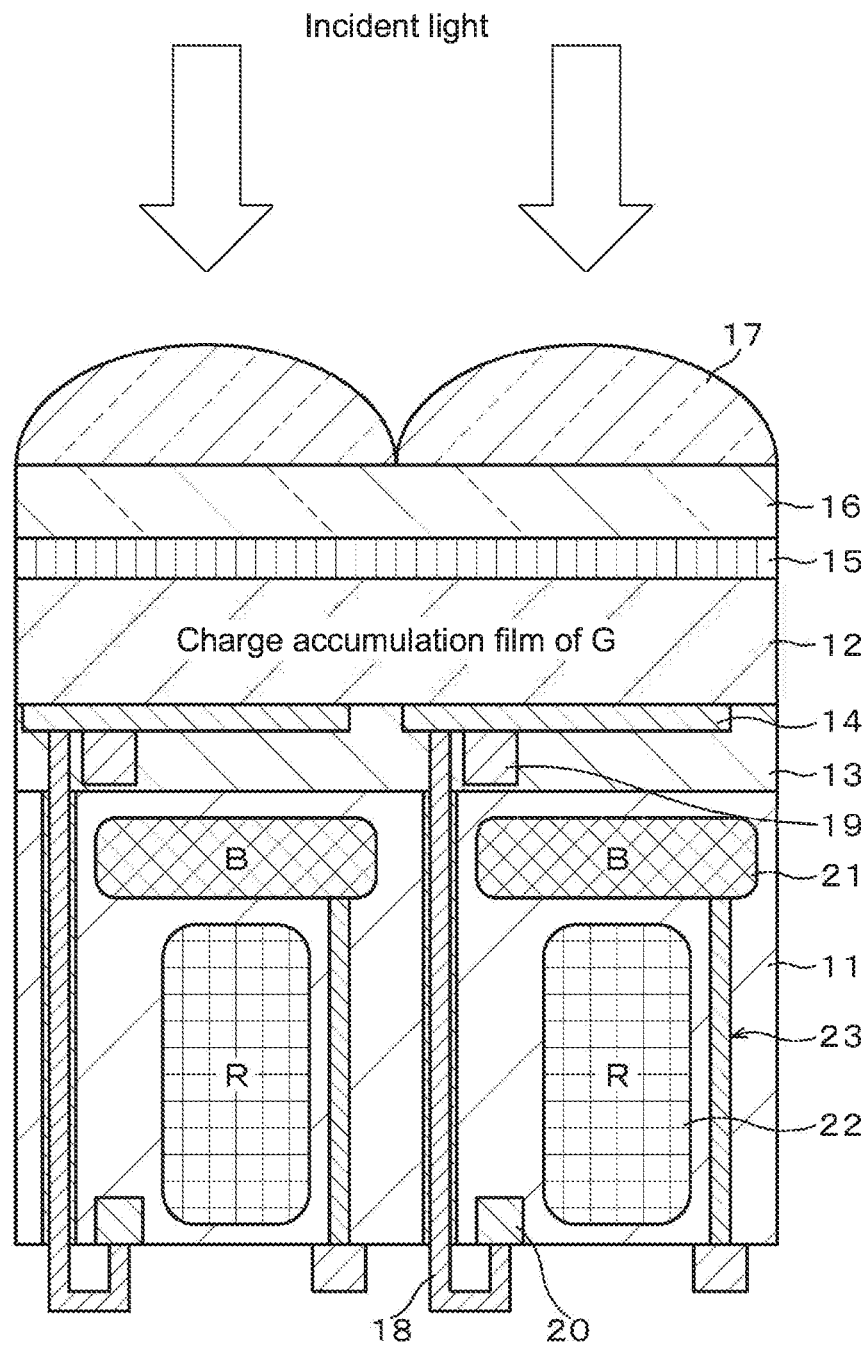
FIG. 3 is a cross-sectional view of a solid-state imaging device according to Embodiment 3 of the present disclosure.

Embodiment 3 is an example in which the photoelectric conversion film is formed of a charge accumulation film in the laminated structure of the three colors in which the green-light photoelectric conversion film 12, the photoelectric conversion region 21, and the red-light photoelectric conversion region 22 are laminated in the optical axis direction of the incident light. FIG. 3 shows a cross-sectional view of a solid-state imaging device according to Embodiment 3 of the present disclosure.

As shown in FIG. 3, the solid-state imaging device according to Embodiment 3 is characterized by using a charge accumulation film, which is formed of an organic material and has sensitivity mainly to the green wavelength range, as the green-light photoelectric conversion film 12 that is provided outside the silicon substrate 11. The organic material of the charge accumulation film capable of accumulating charge only needs to have sensitivity to the green wavelength range and is capable of accumulating charge. The material is not particularly limited.

A bias voltage is applied also to the green-light photoelectric conversion film 12 formed of a charge accumulation film in order to impart an avalanche function thereto. Charge obtained by the photoelectric conversion of the green-light photoelectric conversion film 12 formed of the charge accumulation film and then accumulated therein is transferred to the floating diffusion 20 through the wire 18 under the control of the gate portion 19. The gate portion 19 is formed to be adjacent to the photoelectric conversion film 12.

In such a manner, since the charge obtained by the photoelectric conversion of the green-light photoelectric conversion film 12 can be accumulated in the photoelectric conversion film 12, the floating diffusion 20 for green can be shared as a floating diffusion for another color, which provides an advantage that a circuit region of the pixel can be reduced in size. Incidentally, in a case where the green-light photoelectric conversion film 12 has a structure including a normal laminated film, the charge obtained by the photoelectric conversion of the green-light photoelectric conversion film 12 is to be accumulated in the floating diffusion 20, and thus the floating diffusion 20 for green cannot be shared as a floating diffusion for another color.

It should be noted that this embodiment is a modified example of Embodiment 1, but as a modified example of Embodiment 2, this embodiment can also have a structure using a charge accumulation film, which is formed of an inorganic material and has sensitivity mainly to the green wavelength range, as the green-light photoelectric conversion film 12.

Embodiment 4

Figure 4:
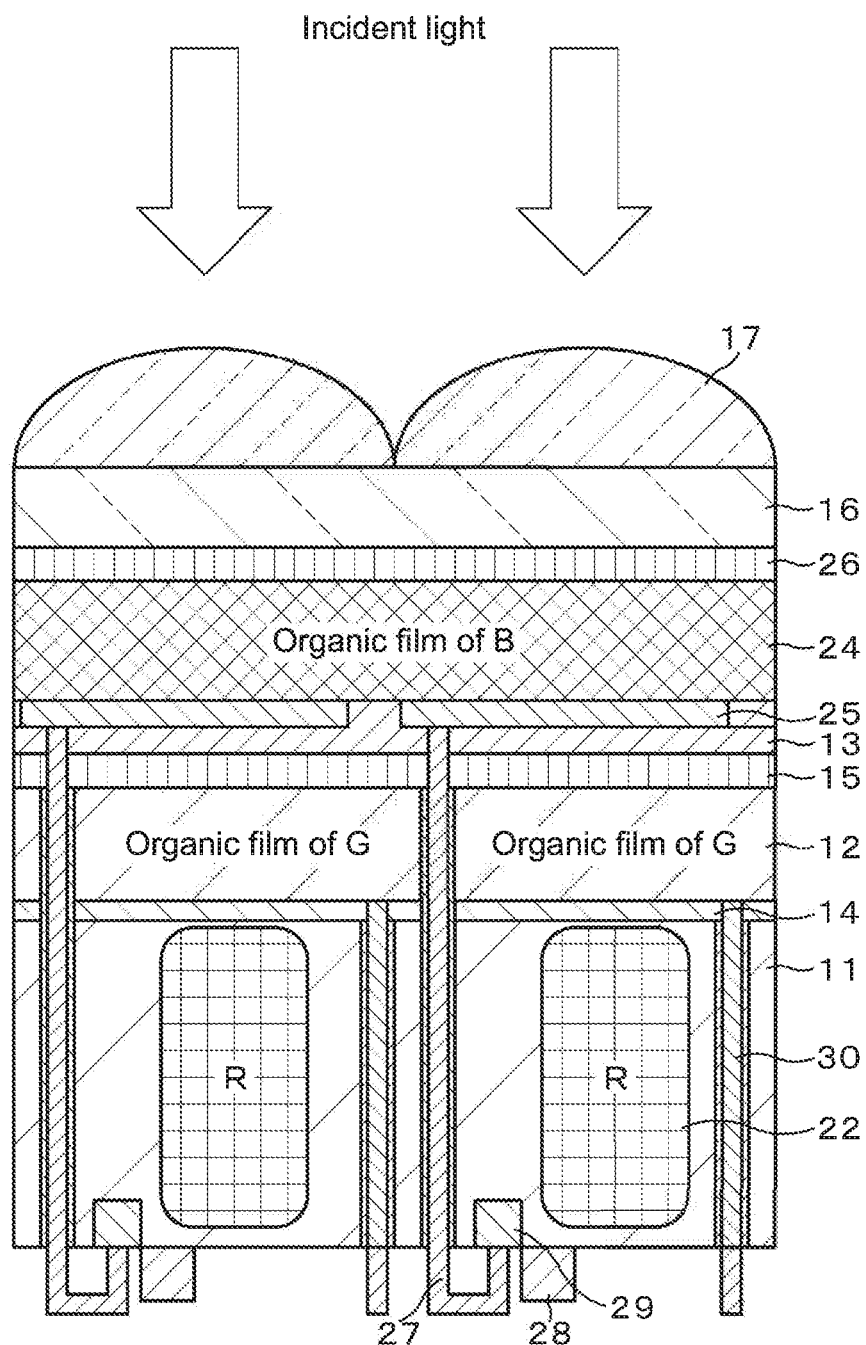
FIG. 4 is a cross-sectional view of a solid-state imaging device according to Embodiment 4 of the present disclosure.

Embodiment 4 is an example in which the photoelectric conversion film is formed of two layers of organic films in the laminated structure in which photoelectric conversion units corresponding to three colors are laminated in the optical axis direction of the incident light. FIG. 4 shows a cross-sectional view of a solid-state imaging device according to Embodiment 4 of the present disclosure.

As shown in FIG. 4, the solid-state imaging device according to Embodiment 4 is characterized by having a two-layer structure in which two photoelectric conversion films provided outside the silicon substrate 11 are each formed of an organic film and are laminated in the optical axis direction of the incident light. Specifically, the solid-state imaging device has a structure in which a blue-light photoelectric conversion film 24 is provided on the lens 17 side, the green-light photoelectric conversion film 12 is provided on the silicon substrate 11 side, and light is dispersed by a difference in depth position in the optical axis direction of the incident light.

Further, when the organic materials of the blue-light photoelectric conversion film 24 and the green-light photoelectric conversion film 12 are selected, the photoelectric conversion film 24 and the photoelectric conversion film 12 can be provided with high wavelength selectivity. In such a manner, when the film quality of the organic films used as the blue-light photoelectric conversion film 24 and the green-light photoelectric conversion film 12 is provided with the wavelength selectivity, light having different wavelengths are absorbed in the organic films of the blue-light photoelectric conversion film 24 and the green-light photoelectric conversion film 12.

Specifically, the blue-light photoelectric conversion film 24 absorbs light having the blue wavelength range, in the light that has come through the lens 17, performs photoelectric conversion thereon, and transmits light having wavelength ranges other than the blue wavelength range. The green-light photoelectric conversion film 12 absorbs light having the green wavelength range, in the light that has passed through the blue-light photoelectric conversion film 24, performs photoelectric conversion thereon, and transmits light having wavelength ranges other than the green wavelength range.

In the case of such dispersion in a vertical direction (optical axis direction of incident light), an incident surface side of the incident light has a short wavelength, and the silicon substrate 11 side has a long wavelength. It should be noted that, in a case where the film quality of the organic films used as the blue-light photoelectric conversion film 24 and the green-light photoelectric conversion film 12 is changed, there is no need to consider the order for a correspondence between the color and the film, and the order is arbitrary.

The organic materials of the blue-light photoelectric conversion film 24 and the green-light photoelectric conversion film 12 are not particularly limited. Further, as in the case of Embodiment 1, when a predetermined bias voltage is applied to each of the blue-light photoelectric conversion film 24 and the green-light photoelectric conversion film 12, the photoelectric conversion film 24 and the photoelectric conversion film 12 are provided with an avalanche function. Each bias voltage is determined depending on each material of the photoelectric conversion film 24 and the photoelectric conversion film 12.

On the lower surface side of the green-light photoelectric conversion film 12, the lower electrode 14 formed of a transparent electrode is provided on a pixel-by-pixel basis. On the upper surface side of the green-light photoelectric conversion film 12, the upper electrode 15 formed of a transparent electrode is provided in common to all the pixels. Similarly, on the lower surface side of the blue-light photoelectric conversion film 24, lower electrodes 25 each formed of a transparent electrode are provided on a pixel-by-pixel basis. On the upper surface side of the blue-light photoelectric conversion film 24, an upper electrode 26 formed of a transparent electrode is provided in common to all the pixels.

Charge obtained by the photoelectric conversion of the blue-light photoelectric conversion film 24 is accumulated in a floating diffusion 29 from the lower electrode 25 through a wire 27 under the control of a gate portion 28. The floating diffusion 29 is formed on the front surface side of the silicon substrate 11. Charge obtained by the photoelectric conversion of the green-light photoelectric conversion film 12 is accumulated in a floating diffusion (not shown) from the lower electrode 14 through a wire 30 under the control of a gate portion (not shown). The floating diffusion is formed on the front surface side of the silicon substrate 11.

The silicon substrate 11 includes the red-light photoelectric conversion region 22 formed as a photoelectric conversion region corresponding to one color. The red-light photoelectric conversion region 22 absorbs light having the red wavelength range, in the light that has passed through the green-light photoelectric conversion film 12 and entered the silicon substrate 11, and performs photoelectric conversion thereon. Charge obtained by the photoelectric conversion of the blue-light photoelectric conversion region 21 is accumulated in a floating diffusion (not shown) that is formed inside the photoelectric conversion region 21 or on the surface side opposite to the incident light side of the silicon substrate 11, as in the case of Embodiment 1.

As described above, with the pixel structure of the solid-state imaging device according to the Embodiment 4, the photoelectric conversion using two-color dispersion is performed by the blue-light photoelectric conversion film 24 and the green-light photoelectric conversion film 12, which are provided outside the silicon substrate 11 and are formed of organic films having an avalanche function. Further, the photoelectric conversion using absorption of the light of one color is performed by the red-light photoelectric conversion region 22 provided inside the silicon substrate 11.

In particular, in the pixel structure of the solid-state imaging device according to Embodiment 4, since the photoelectric conversion films corresponding to the two colors of blue and green have the avalanche function, as compared with the pixel structure of the solid-state imaging device according to Embodiment 1, a pixel signal level can be increased even with a small amount of incident light. Thus, an image with less feeling of noise can be obtained.

It should be noted that, in Embodiment 4, the photoelectric conversion region corresponding to one color is provided inside the silicon substrate 11, but the present disclosure is not limited thereto and only needs to have a configuration including a photoelectric conversion region corresponding to at least one color. The same holds true for Embodiment 5 to be described below.

Embodiment 5

Figure 5:
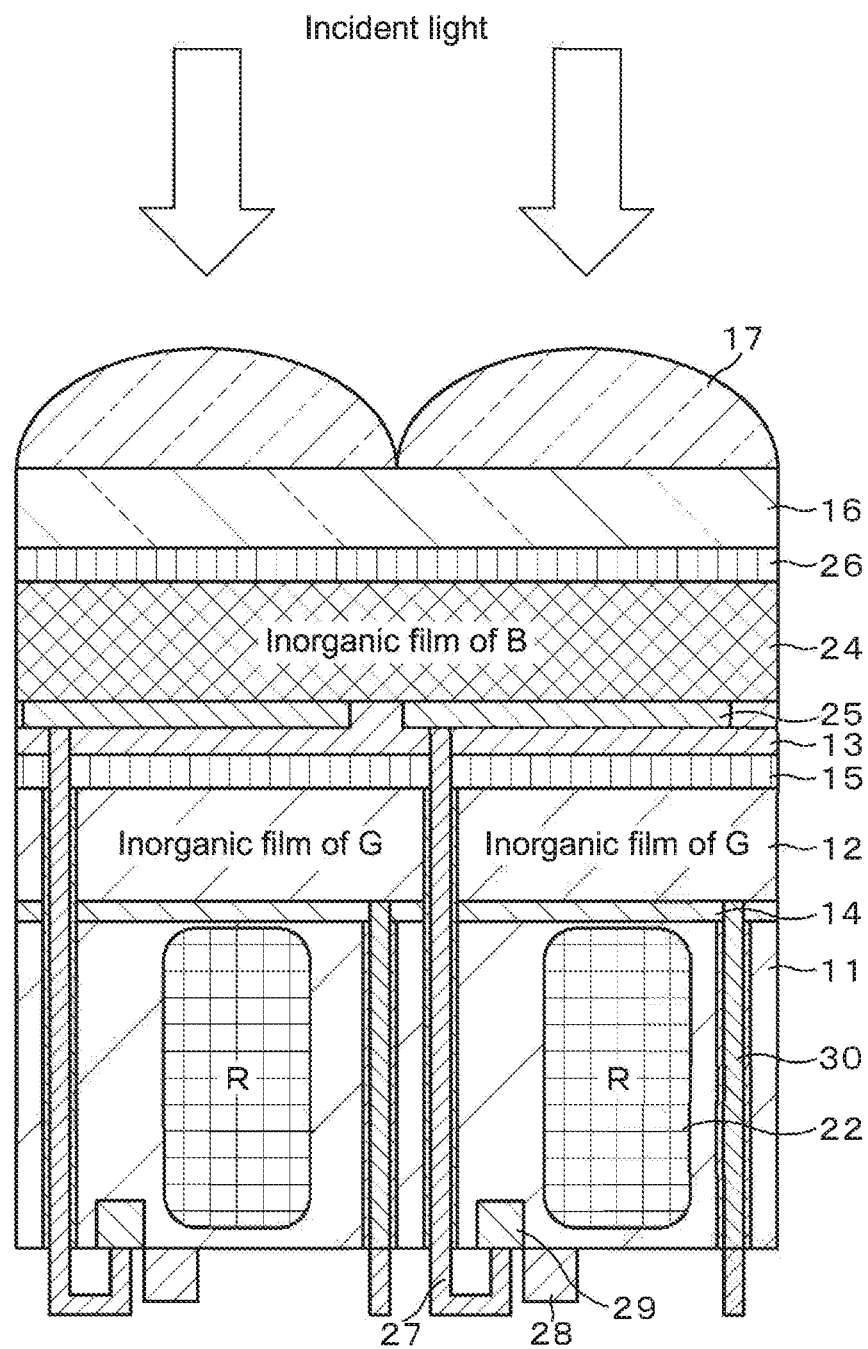
FIG. 5 is a cross-sectional view of a solid-state imaging device according to Embodiment 5 of the present disclosure.

Embodiment 5 is a modified example of Embodiment 4 and is an example in which the photoelectric conversion film is formed of two layers of inorganic films in the laminated structure in which photoelectric conversion units corresponding to three colors are laminated in the optical axis direction of the incident light. FIG. 5 shows a cross-sectional view of a solid-state imaging device according to Embodiment 5 of the present disclosure.

As shown in FIG. 5, the solid-state imaging device according to Embodiment 5 is characterized by using, as the green-light photoelectric conversion film 12, an inorganic film formed of an inorganic material and having sensitivity mainly to the green wavelength range and by using, as the blue-light photoelectric conversion film 24, an inorganic film formed of an inorganic material and having sensitivity mainly to the blue wavelength range.

The inorganic materials of the blue-light photoelectric conversion film 24 and the green-light photoelectric conversion film 12 are not particularly limited. Further, as in the case of Embodiment 2, when a predetermined bias voltage is applied to each of the blue-light photoelectric conversion film 24 and the green-light photoelectric conversion film 12, the photoelectric conversion film 24 and the photoelectric conversion film 12 can be provided with an avalanche function. Each bias voltage is determined depending on each material of the photoelectric conversion film 24 and the photoelectric conversion film 12.

Embodiment 6

Figure 6:
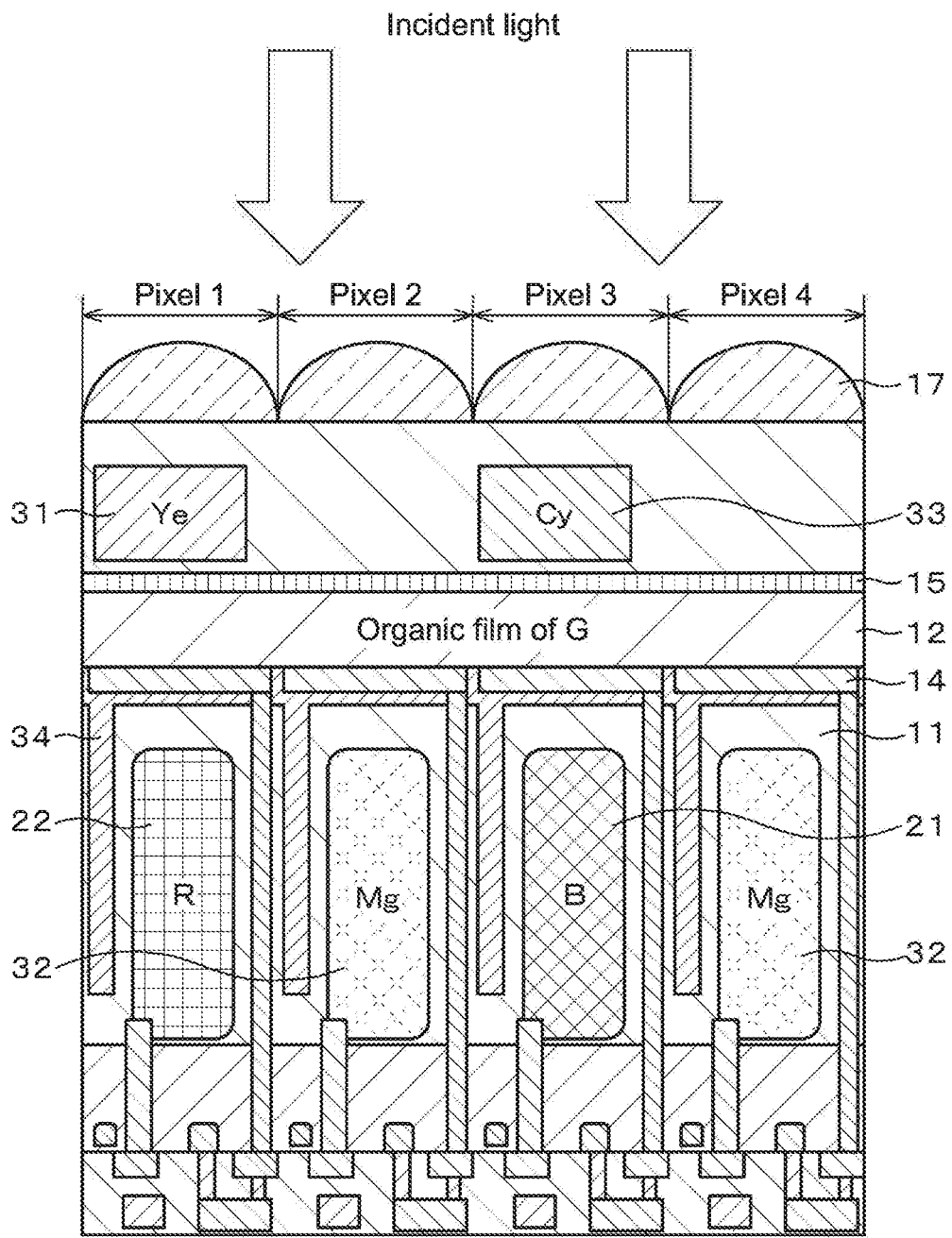
FIG. 6 is a cross-sectional view of a solid-state imaging device according to Embodiment 6 of the present disclosure.

Embodiment 6 is an example in which the photoelectric conversion film is formed of an organic film in the laminated structure in which photoelectric conversion units corresponding to two colors are laminated in the optical axis direction of the incident light. FIG. 6 shows a cross-sectional view of a solid-state imaging device according to Embodiment 6 of the present disclosure. FIG. 6 shows a cross-sectional structure corresponding to four pixels, and the four pixels are referred to as a pixel 1, a pixel 2, a pixel 3, and a pixel 4 for convenience sake. The same holds true for Embodiment 7 to be described below.

As shown in FIG. 6, the solid-state imaging device according to Embodiment 6 has the laminated structure corresponding to two colors in all of the pixel 1 to the pixel 4, in which the green-light (G) photoelectric conversion film 12 and the photoelectric conversion region corresponding to one color are laminated in the optical axis direction of the incident light, the green-light (G) photoelectric conversion film 12 being provided outside the silicon substrate 11, the photoelectric conversion region corresponding to one color being provided inside the silicon substrate 11. The green-light photoelectric conversion film 12 is provided in common to all the pixel 1 to the pixel 4. A predetermined bias voltage is applied to the green-light photoelectric conversion film 12 in order to impart an avalanche function thereto. As the green-light photoelectric conversion film 12, an organic film formed of an organic material and having sensitivity mainly to the green wavelength range is used.

The pixel 1 has a structure in which the green-light photoelectric conversion film 12 provided outside the silicon substrate 11 and a red-light (R) photoelectric conversion region 22 provided inside the silicon substrate 11 are laminated in the optical axis direction of the incident light. Further, in the pixel 1, a complementary color filter 31 that transmits yellow light (Ye) is mounted between the green-light photoelectric conversion film 12 and the lens 17.

The pixel 2 has a structure in which the green-light photoelectric conversion film 12 provided outside the silicon substrate 11 and a magenta-light (Mg) photoelectric conversion region 32 provided inside the silicon substrate 11 are laminated in the optical axis direction of the incident light. As is the case with the pixel 2, the pixel 4 also has a laminated structure of the green-light photoelectric conversion film 12 and the magenta-light photoelectric conversion region 32.

The pixel 3 has a structure in which the green-light photoelectric conversion film 12 provided outside the silicon substrate 11 and a blue-light (B) photoelectric conversion region 21 provided inside the silicon substrate 11 are laminated in the optical axis direction of the incident light. Further, in the pixel 3, a complementary color filter 33 that transmits cyan light (Cy) is mounted between the green-light photoelectric conversion film 12 and the lens 17.

The pixel 1 to the pixel 4 are separated from one another by separation walls 34 provided therebetween. On the surface side opposite to the incident light side of the silicon substrate 11, floating diffusions and a wiring layer including various wires and the like are formed, the floating diffusions converting charge, which is obtained by the photoelectric conversion of the green-light photoelectric conversion film 12, the blue-light photoelectric conversion region 21, the red-light photoelectric conversion region 22, and the magenta-light photoelectric conversion regions 32, into a voltage.

In the solid-state imaging device according to Embodiment 6 having the configuration described above, in the pixel 1, in the light that has come through the lens 17, the yellow light passes through the color filter 31 and enters the green-light photoelectric conversion film 12. Here, the yellow light is mixture of green light and red light. Therefore, the green-light photoelectric conversion film 12 absorbs the green light included in the yellow light and performs photoelectric conversion thereon. The red light that has passed through the green-light photoelectric conversion film 12 then enters the red-light photoelectric conversion region 22, and is then absorbed in the photoelectric conversion region 22 and photoelectrically converted. Thus, in the pixel 1, the photoelectric conversion is performed on the green light and the red light.

In the pixel 2, the green-light photoelectric conversion film 12 provided outside the silicon substrate 11 absorbs the light having the green wavelength range and performs photoelectric conversion thereon, and then transmits light having wavelength ranges other than the green wavelength range. Inside the silicon substrate 11, the magenta-light photoelectric conversion region 32 absorb magenta light, in the light that has passed through the green-light photoelectric conversion film 12 and entered the silicon substrate 11, and performs photoelectric conversion thereon. Incidentally, the magenta light is mixture of red light and blue light. As is the case with the pixel 2, the same holds true for the pixel 4 having the laminated structure of the green-light photoelectric conversion film 12 and the magenta-light photoelectric conversion region 32.

In the pixel 3, in the light that has come through the lens 17, the cyan light passes through the color filter 33 and enters the green-light photoelectric conversion film 12. Here, the cyan light is mixture of green light and blue light. Therefore, the green-light photoelectric conversion film 12 absorbs the green light included in the cyan light and performs photoelectric conversion thereon. The blue light that has passed through the green-light photoelectric conversion film 12 then enters the blue-light photoelectric conversion region 21, and is then absorbed in the photoelectric conversion region 21 and photoelectrically converted. Thus, in the pixel 3, the photoelectric conversion is performed on the green light and the blue light.

Here, in the pixel 1, a green signal obtained by the photoelectric conversion of the green-light photoelectric conversion film 12 and a red signal obtained by the photoelectric conversion of the red-light photoelectric conversion region 22 are added to each other, so that a yellow signal can be obtained. Further, in the pixel 3, a green signal obtained by the photoelectric conversion of the green-light photoelectric conversion film 12 and a blue signal obtained by the photoelectric conversion of the blue-light photoelectric conversion region 21 are added to each other, so that a cyan signal can be obtained.

Therefore, with the solid-state imaging device according to Embodiment 6, assuming that the three pixels of the pixel 1 to the pixel 3 are as a unit, signals based on the primary colors of red, green, and blue can be obtained as pixel signals. In addition, signals based on complementary colors of yellow, cyan, magenta, yellow, and green can be obtained.

It should be noted that, in Embodiment 6, the photoelectric conversion region corresponding to one color is provided inside the silicon substrate 11, but the present disclosure is not limited thereto and only needs to have a configuration including a photoelectric conversion region corresponding to at least one color. The same holds true for Embodiment 7 to be described below.

Embodiment 7

Figure 7:
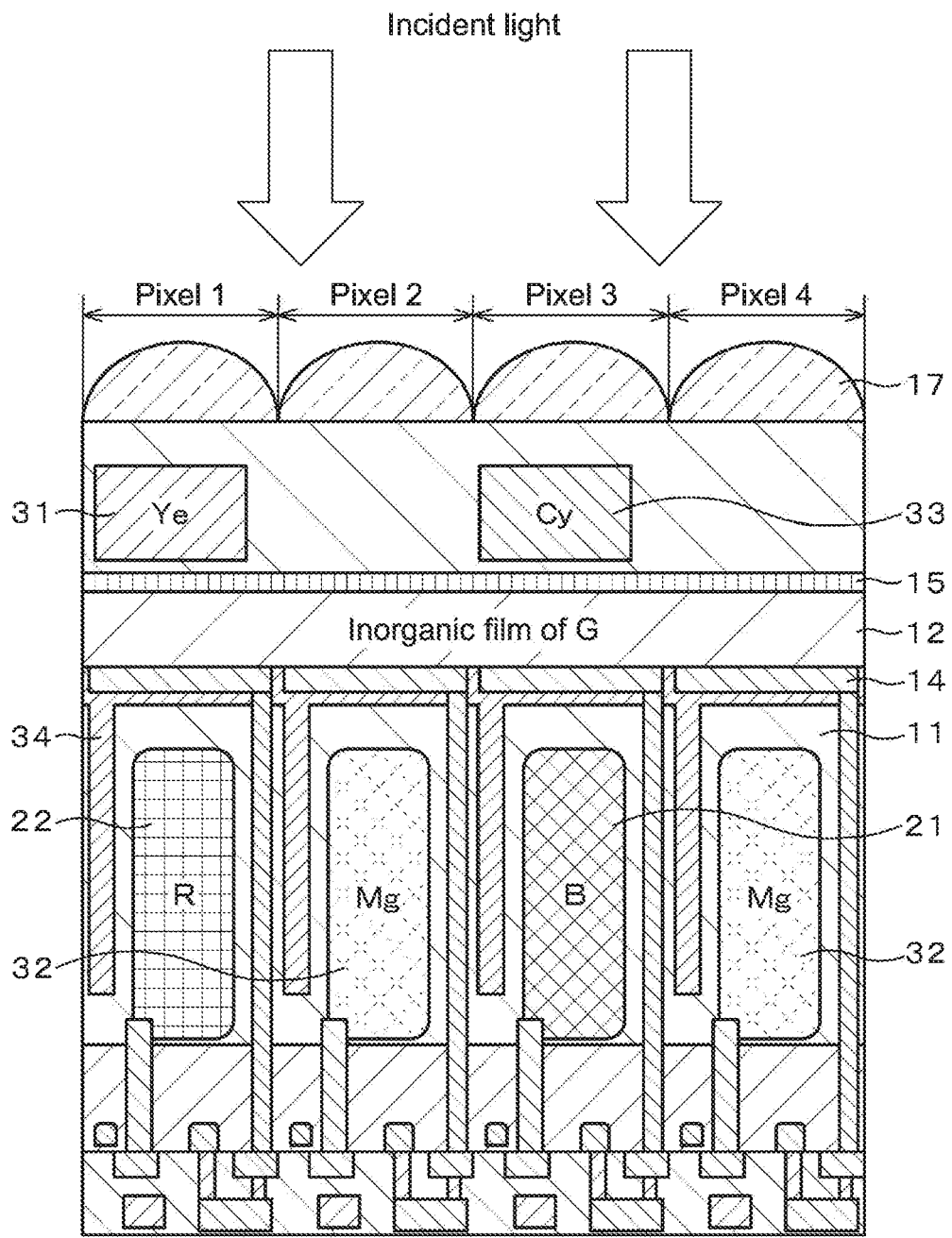
FIG. 7 is a cross-sectional view of a solid-state imaging device according to Embodiment 7 of the present disclosure.

Embodiment 7 is a modified example of Embodiment 6 and is an example in which the photoelectric conversion film is formed of an inorganic film in the laminated structure in which photoelectric conversion units corresponding to two colors are laminated in the optical axis direction of the incident light. FIG. 7 shows a cross-sectional view of a solid-state imaging device according to Embodiment 7 of the present disclosure.

As shown in FIG. 7, the solid-state imaging device according to Embodiment 7 is characterized by using, as the green-light photoelectric conversion film 12 provided outside the silicon substrate 11, an inorganic film formed of an inorganic material and having sensitivity mainly to the green wavelength range. Examples of the inorganic material of the green-light photoelectric conversion film 12 include Se and CIGS, but the present disclosure is not limited thereto. A predetermined bias voltage is applied also to the green-light photoelectric conversion film 12 formed of an inorganic film in order to impart an avalanche function thereto.

Embodiment 8

Figure 8:
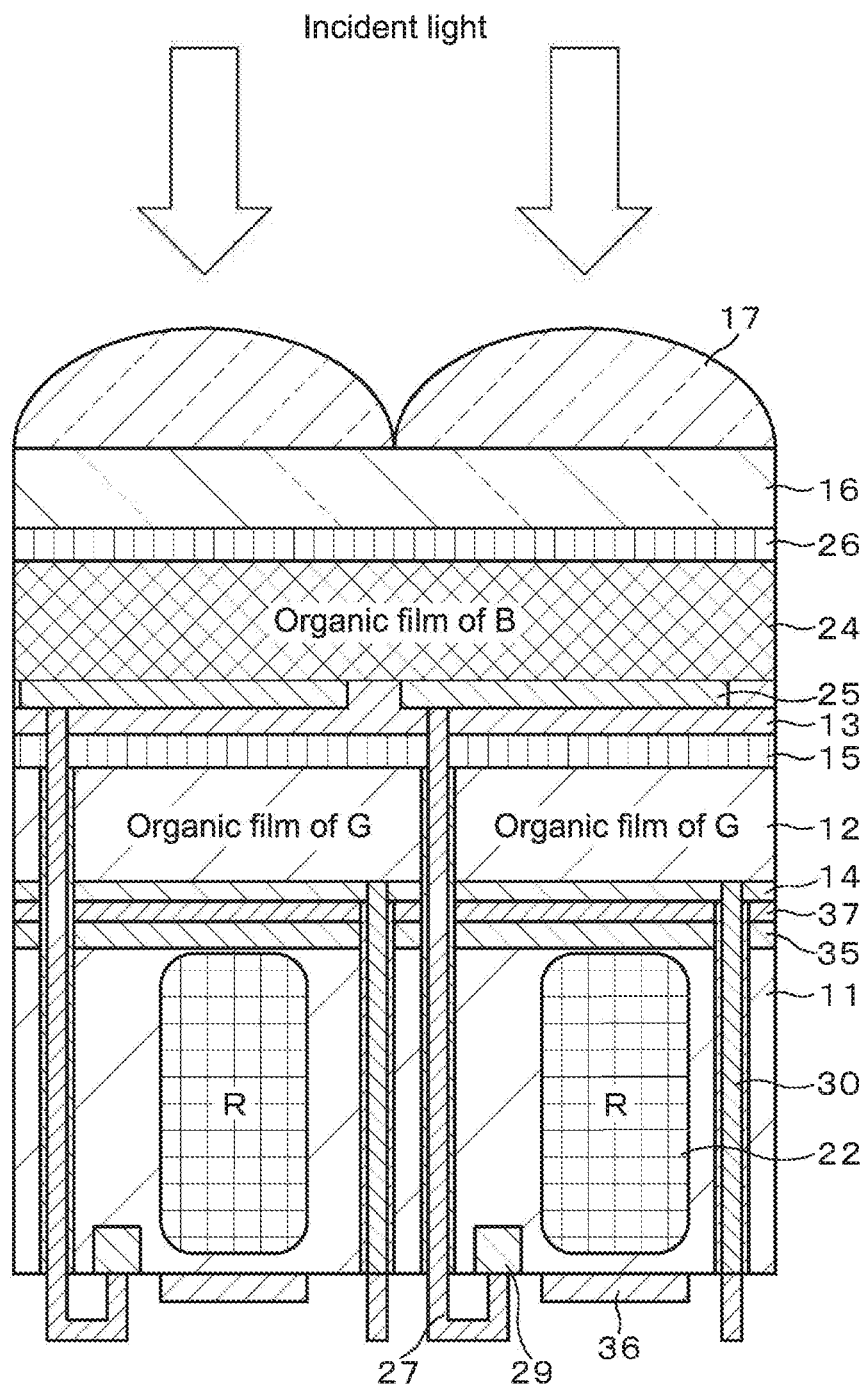
FIG. 8 is a cross-sectional view of a solid-state imaging device of Embodiment 8 according to the present disclosure.

Embodiment 8 is an example using the silicon substrate 11 as an avalanche photodiode (APD) in the solid-state imaging device according to Embodiment 4 in which photoelectric conversion units corresponding to three colors are laminated in the optical axis direction of the incident light and the photoelectric conversion film is formed of two layers of organic films. FIG. 8 shows a cross-sectional view of a solid-state imaging device of Embodiment 8 according to the present disclosure.

As shown in FIG. 8, in order to use the silicon substrate 11 as an avalanche photodiode, a common electrode 35 is provided in common to all the pixels on the upper surface of the silicon substrate 11, and a pixel electrode 36 is provided for each of the pixels on the lower surface of the silicon substrate 11. Further, an insulating film 37 intervenes between the lower electrode 14 of the green-light photoelectric conversion film 12 and the common electrode 35.

In the solid-state imaging device according to Embodiment 8 having the configuration described above, when a predetermined voltage (e.g., several tens to 200 V) is applied between the common electrode 35 and the pixel electrode 36, the silicon substrate 11 can be used as an avalanche photodiode.

It should be noted that this is not limited to the solid-state imaging device according to Embodiment 4 in which the photoelectric conversion film is formed of two layers of organic films, and it is possible to use the silicon substrate 11 as an avalanche photodiode also in the solid-state imaging device according to Embodiment 5 in which the photoelectric conversion film is formed of two layers of inorganic films.

Embodiment 9

Figure 9:
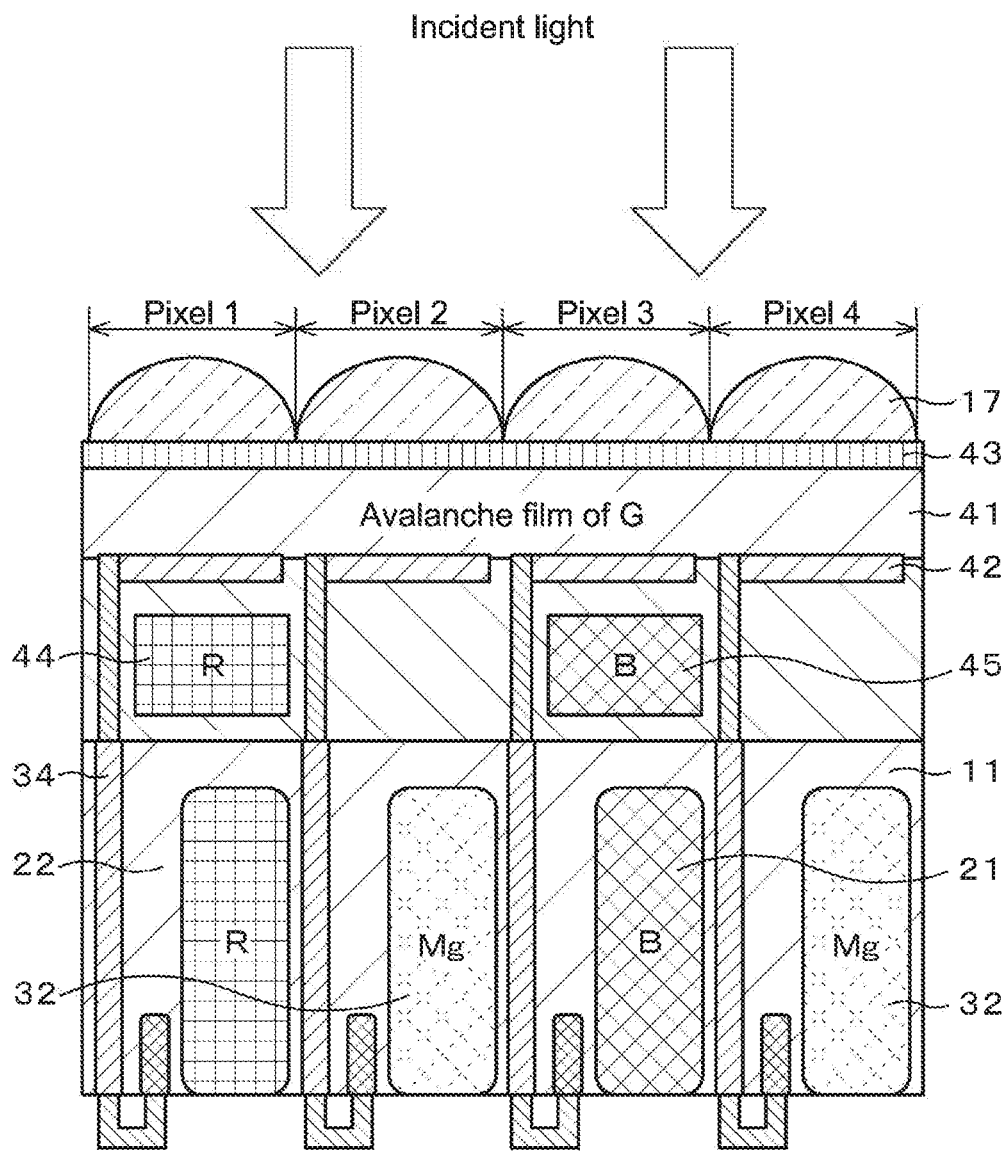
FIG. 9 is a cross-sectional view of a solid-state imaging device according to Embodiment 9 of the present disclosure.

Embodiment 9 is another example of Embodiment 6 and Embodiment 7 employing the laminated structure corresponding to two colors. FIG. 9 shows a cross-sectional view of a solid-state imaging device according to Embodiment 9 of the present disclosure. FIG. 9 shows a cross-sectional structure corresponding to four pixels, and the four pixels are referred to as a pixel 1, a pixel 2, a pixel 3, and a pixel 4 for convenience sake.

As shown in FIG. 9, the solid-state imaging device according to Embodiment 9 has a laminated structure corresponding to two colors in all of the pixel 1 to the pixel 4, in which a green-light (G) avalanche film 41 and the photoelectric conversion region corresponding to one color are laminated in the optical axis direction of the incident light, the green-light (G) avalanche film 41 being provided outside the silicon substrate 11, the photoelectric conversion region corresponding to one color being provided inside the silicon substrate 11. The green-light avalanche film 41 is provided in common to all the pixel 1 to the pixel 4.

The green-light avalanche film 41 may be formed of an organic film as in the case of Embodiment 6 or may be formed of an inorganic film as in the case of Embodiment 7. On the lower surface side of the green-light avalanche film 41, lower electrodes 42 each formed of a transparent electrode are provided on a pixel-by-pixel basis. On the upper surface side of the green-light avalanche film 41, an upper electrode 43 formed of a transparent electrode is provided in common to all the pixels.

The pixel 1 has a structure in which the green-light (G) avalanche film 41 provided outside the silicon substrate 11 and a red-light (R) photoelectric conversion region 22 provided inside the silicon substrate 11 are laminated in the optical axis direction of the incident light. Further, in the pixel 1, a color filter 44 that transmits red light is mounted between the green-light avalanche film 41 and the silicon substrate 11.

The pixel 2 has a structure in which the green-light avalanche film 41 provided outside the silicon substrate 11 and a magenta-light (Mg) photoelectric conversion region 32 provided inside the silicon substrate 11 are laminated in the optical axis direction of the incident light. As is the case with the pixel 2, the pixel 4 also has a laminated structure of the green-light avalanche film 41 and the magenta-light photoelectric conversion region 32.

The pixel 3 has a structure in which the green-light avalanche film 41 provided outside the silicon substrate 11 and a blue-light (B) photoelectric conversion region 21 provided inside the silicon substrate 11 are laminated in the optical axis direction of the incident light. Further, in the pixel 3, a color filter 45 that transmits blue light is mounted between the green-light avalanche film 41 and the silicon substrate 11.

In the solid-state imaging device according to Embodiment 9 having the configuration described above, the green-light avalanche film 41 provided in common to all of the pixel 1 to the pixel 4 absorbs green light included in the light that has come through the lens 17, performs photoelectric conversion thereon, and transmits light having wavelength ranges other than the green wavelength range. With this configuration, signals of green light can be obtained in all of the pixel 1 to the pixel 4. Subsequently, the following photoelectric conversion is performed in each of the pixel 1 to the pixel 4.

In the pixel 1, in the light that has passed through the green-light avalanche film 41, red light that has passed through the color filter 44 for red light enters the silicon substrate 11. The red light that has entered the silicon substrate 11 then enters the red-light photoelectric conversion region 22, and is then absorbed in the photoelectric conversion region 22 and photoelectrically converted. Thus, in the pixel 1, the photoelectric conversion is performed on the green light and the red light.

In the pixel 2, magenta light included in the light that has passed through the green-light avalanche film 41 and entered the silicon substrate 11 is photoelectrically converted in the magenta-light photoelectric conversion region 32. Thus, in the pixel 2, the photoelectric conversion is performed on the green light and the magenta light. As is the case with the pixel 2, also in the pixel 4 having the laminated structure of the green-light avalanche film 41 and the magenta-light photoelectric conversion region 32, the photoelectric conversion is performed on the green light and the magenta light.

In the pixel 3, in the light that has passed through the green-light avalanche film 41, blue light that has passed through the color filter 45 for blue light enters the silicon substrate 11. The blue light that has entered the silicon substrate 11 then enters the blue-light photoelectric conversion region 21, and is then absorbed in the photoelectric conversion region 21 and photoelectrically converted. Thus, in the pixel 3, the photoelectric conversion is performed on the green light and the blue light.

As described above, in the pixel 1, the photoelectric conversion is performed on the green light and the red light, and thus signals of green and red are to be output from the pixel 1. In the pixel 2 and the pixel 4, the photoelectric conversion is performed on the green light and the magenta light, and thus signals of green and magenta are to be output from the pixel 2 and the pixel 4. As will be described later, when the green signal and the magenta signal are added to each other, a white (W) signal can be obtained. In the pixel 3, the photoelectric conversion is performed on the green light and the blue light, and thus signals of green and blue are to be output from the pixel 3.

<Modified Example>

Hereinabove, the present disclosure has been described on the basis of the favorable embodiments, but the present disclosure is not limited to those embodiments. The configurations and structures of the solid-state imaging devices described in the respective embodiments are examples and can be appropriately changed. For example, in the embodiments described above, the technology of the present disclosure has been described using an example of a CMOS image sensor as one type of X-Y address type solid-state imaging device, but the technology of the present disclosure is also applicable to a CCD (Charge Coupled Device) type image sensor in a similar manner.

<Electronic Apparatus of Present Disclosure>

The solid-state imaging devices according to Embodiment 1 to Embodiment 7 described above can be used as an imaging unit (image capturing unit) of all electronic apparatuses including imaging apparatuses such as a digital still camera and a video camera, portable terminal apparatuses having an imaging function such as a mobile phone, and copying machines using a solid-state imaging device for an image reading unit. It should be noted that the solid-state imaging device may be formed as a single chip or may have a module-like form having an imaging function, in which an imaging unit and a signal processing unit or optical system are integrally packaged. The above-mentioned module-like form provided to the electronic apparatus, i.e., a camera module is considered as an imaging apparatus in some cases.

[Imaging Apparatus]

Figure 10:
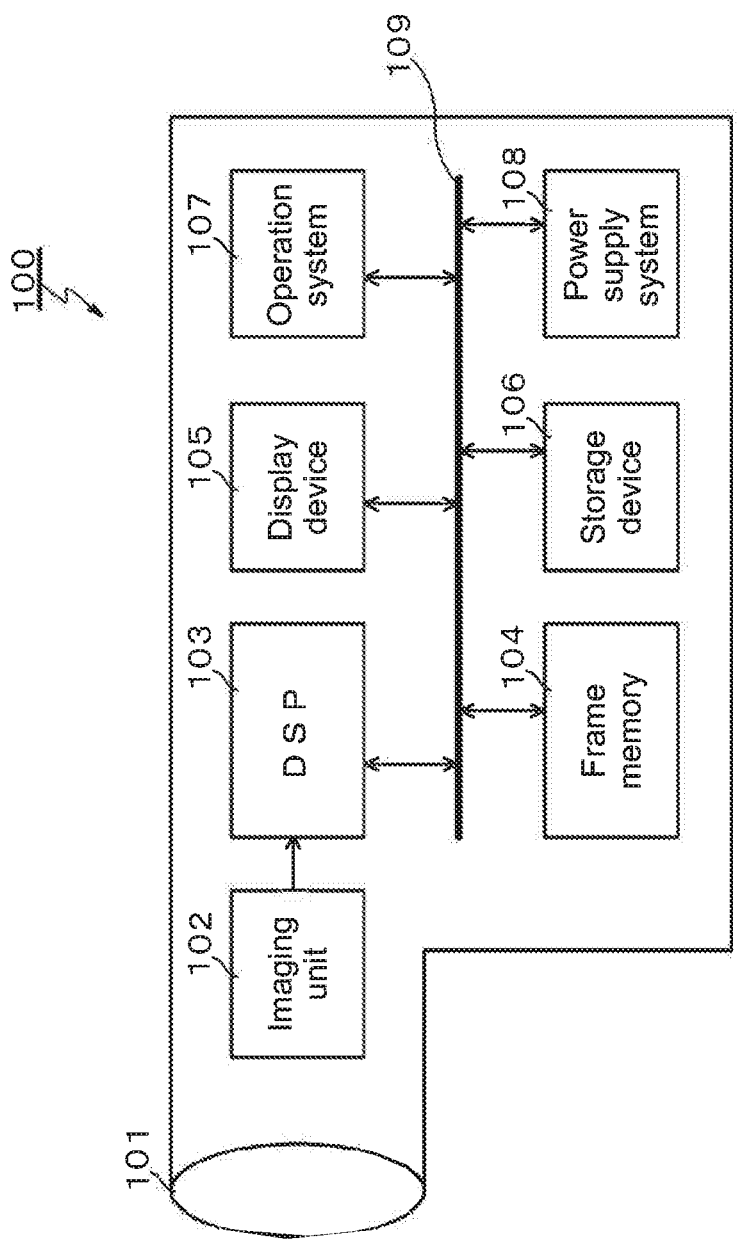
FIG. 10 is a block diagram showing a configuration of an imaging apparatus as an example of an electronic apparatus of the present disclosure.

FIG. 10 is a block diagram showing a configuration of an imaging apparatus as an example of an electronic apparatus according to the present disclosure. As shown in FIG. 10, an imaging apparatus 100 according to this embodiment includes an optical system 101 including a lens group and the like, an imaging unit 102, a DSP circuit 103, a frame memory 104, a display device 105, a recording device 106, an operation system 107, a power supply system 108, and the like. The DSP circuit 103, the frame memory 104, the display device 105, the recording device 106, the operation system 107, and the power supply system 108 are connected to one another via a bus line 109.

The optical system 101 takes in incident light coming from a subject (image light) and forms an image on an imaging surface of the imaging unit 102. The imaging unit 102 converts the amount of incident light, with which the image is formed on the imaging surface by the optical system 101, into an electrical signal on a pixel-by-pixel basis and outputs the electrical signal as a pixel signal. The DSP circuit 103 performs general camera signal processing, for example, white balance processing, demosaic processing, and gamma correction processing.

The frame memory 104 is used to store data appropriately in the process of the signal processing of the DSP circuit 103. The display device 105 is formed of a panel display device such as a liquid crystal display device or an organic EL (Electro Luminescence) display device and displays moving images or still images captured by the imaging unit 102. The recording device 106 records the moving images or still images captured by the imaging unit 102 on a recording medium such as a portable semiconductor memory, an optical disc, or an HDD (Hard Disk Drive).

The operation system 107 issues an operation command on various functions of the imaging apparatus 100 under the operation of a user. The power supply system 108 appropriately supplies various types of power, by which the DSP circuit 103, the frame memory 104, the display device 105, the recording device 106, and the operation system 107 operate, to those supply targets.

In the imaging apparatus 100 having the configuration described above, the solid-state imaging device according to each of Embodiment 1 to Embodiment 9 described above can be used as the imaging unit 102. The solid-state imaging device according to each of Embodiment 1 to Embodiment 9 can improve sensitivity by using a film having an avalanche function as the photoelectric conversion film. With this configuration, more reduction in size of the chip area can be achieved in the solid-state imaging device having the lamination-type pixel structure. Therefore, using the solid-state imaging device according to each of Embodiment 1 to Embodiment 9 as the imaging unit 102 can contribute to a reduction in size of the imaging unit 102 and also to a reduction in size of the imaging apparatus.

Further, in a case where the solid-state imaging device according to Embodiment 6 or Embodiment 9 is used as the imaging unit 102, when the magenta signal and the green signal output from this solid-state imaging device are added to each other in the signal processing of the DSP circuit 103, a W output signal corresponding to white (W) can be obtained.

It should be noted that the present disclosure can take the following configurations.

[1] A solid-state imaging device, including:
a photoelectric conversion film that is provided outside a semiconductor substrate on a pixel-by-pixel basis, performs photoelectric conversion on light having a predetermined wavelength range, and transmits light having wavelength ranges other than the predetermined wavelength range; and
a photoelectric conversion region that is provided inside the semiconductor substrate on a pixel-by-pixel basis and performs photoelectric conversion on the light having the wavelength ranges, the light having the wavelength ranges having passed through the photoelectric conversion film,
the photoelectric conversion film including a film having an avalanche function.

[2] The solid-state imaging device according to [1], in which
the photoelectric conversion film is an organic film formed of an organic material.

[3] The solid-state imaging device according to [1], in which
the photoelectric conversion film is an inorganic film formed of an inorganic material.

[4] The solid-state imaging device according to [1] or [2], in which
the photoelectric conversion film has a function of accumulating charge obtained by the photoelectric conversion.

[5] The solid-state imaging device according to [1], in which
the photoelectric conversion film includes laminated photoelectric conversion films corresponding to two colors, and
each of the photoelectric conversion films corresponding to the two colors is formed of the film having the avalanche function.

[6] The solid-state imaging device according to [5], in which
each of the photoelectric conversion films corresponding to the two colors is an organic film formed of an organic material.

[7] The solid-state imaging device according to [5], in which
each of the photoelectric conversion films corresponding to the two colors is an inorganic film formed of an inorganic material.

[8] The solid-state imaging device according to any one of [5] to [7], in which
in the photoelectric conversion films corresponding to the two colors, the photoelectric conversion film on an incident light side performs photoelectric conversion on blue light, and the photoelectric conversion film on the semiconductor substrate side performs photoelectric conversion on green light, and
the photoelectric conversion region provided inside the semiconductor substrate performs photoelectric conversion on red light.

[9] The solid-state imaging device according to any one of [1] to [4], in which
the photoelectric conversion region is provided inside the semiconductor substrate and corresponds to at least one color, and
a color filter is mounted on an incident light side of the photoelectric conversion film provided outside the semiconductor substrate.

[10] The solid-state imaging device according to [9], in which
the color filter includes a complementary color filter.

[11] An electronic apparatus, including
a solid-state imaging device including
a photoelectric conversion film that is provided outside a semiconductor substrate on a pixel-by-pixel basis, performs photoelectric conversion on light having a predetermined wavelength range, and transmits light having wavelength ranges other than the predetermined wavelength range, and
a photoelectric conversion region that is provided inside the semiconductor substrate on a pixel-by-pixel basis and performs photoelectric conversion on the light having the wavelength ranges, the light having the wavelength ranges having passed through the photoelectric conversion film,
the photoelectric conversion film including a film having an avalanche function.

[12] The electronic apparatus according to [11], in which
the photoelectric conversion film is an organic film formed of an organic material.

[13] The electronic apparatus according to [11], in which
the photoelectric conversion film is an inorganic film formed of an inorganic material.

[14] The electronic apparatus according to [11] or [12], in which
the photoelectric conversion film has a function of accumulating charge obtained by the photoelectric conversion.

[15] The electronic apparatus according to [11], in which
the photoelectric conversion film includes laminated photoelectric conversion films corresponding to two colors, and
each of the photoelectric conversion films corresponding to the two colors is formed of the film having the avalanche function.

[16] The electronic apparatus according to [15], in which
each of the photoelectric conversion films corresponding to the two colors is an organic film formed of an organic material.

[17] The electronic apparatus according to [15], in which
each of the photoelectric conversion films corresponding to the two colors is an inorganic film formed of an inorganic material.

[18] The electronic apparatus according to any one of [15] to [17], in which
in the photoelectric conversion films corresponding to the two colors, the photoelectric conversion film on an incident light side performs photoelectric conversion on blue light, and the photoelectric conversion film on the semiconductor substrate side performs photoelectric conversion on green light, and the photoelectric conversion region provided inside the semiconductor substrate performs photoelectric conversion on red light.

[19] The electronic apparatus according to any one of [11] to [14], in which the photoelectric conversion region is provided inside the semiconductor substrate and corresponds to at least one color, and a color filter is mounted on an incident light side of the photoelectric conversion film provided outside the semiconductor substrate.

[20] The electronic apparatus according to [19], in which
the color filter includes a complementary color filter.

REFERENCE SIGNS LIST 11 silicon substrate
12 green-light photoelectric conversion film
13, 37, 42 insulating film
14, 25, 43 lower electrode
15, 26 upper electrode
16 transparent insulating film
17 lens (on-chip lens)
18 wire
19 gate portion
20, 29 floating diffusion
21 blue-light photoelectric conversion region
22 red-light photoelectric conversion region
23 vertical transistor
24 blue-light photoelectric conversion film
31 color filter for yellow
32 magenta-light photoelectric conversion region
33 color filter for cyan
34 separation wall
35 common electrode
36 pixel electrode
41 green-light avalanche film
44 color filter for red light
45 color filter for blue light

The invention claimed is:

1. A solid-state imaging device, comprising:
a photoelectric conversion film above a semiconductor substrate, wherein the photoelectric conversion film is configured to:
perform photoelectric conversion on light having a first wavelength range; and
transmit light having a second wavelength range different from the first wavelength range;
a color filter between the photoelectric conversion film and the semiconductor substrate; and
a photoelectric conversion region inside the semiconductor substrate, wherein
the photoelectric conversion region is configured to perform photoelectric conversion on the light having the second wavelength range,
the light having the second wavelength range passes through the photoelectric conversion film, and
the photoelectric conversion film has an avalanche function.

2. The solid-state imaging device according to claim 1, wherein the photoelectric conversion film is an organic film that includes an organic material.

3. The solid-state imaging device according to claim 1, wherein the photoelectric conversion film is an inorganic film that includes an inorganic material.

4. The solid-state imaging device according to claim 1, wherein the photoelectric conversion film has a function of accumulating charge obtained by the photoelectric conversion on the light having the first wavelength range.

5. The solid-state imaging device according to claim 1, wherein
the photoelectric conversion film includes laminated photoelectric conversion films corresponding to two colors, and
each of the photoelectric conversion films corresponding to the two colors includes a film having the avalanche function.

6. The solid-state imaging device according to claim 5, wherein each of the photoelectric conversion films corresponding to the two colors is an organic film that includes an organic material.

7. The solid-state imaging device according to claim 5, wherein each of the photoelectric conversion films corresponding to the two colors is an inorganic film that includes an inorganic material.

8. The solid-state imaging device according to claim 5, wherein
a first photoelectric conversion film of the photoelectric conversion films is on an incident light side of the solid-state imaging device,
the first photoelectric conversion film is configured to perform photoelectric conversion on blue light,
a second photoelectric conversion film of the photoelectric conversion films is on a semiconductor substrate side of the solid-state imaging device,
the second photoelectric conversion film is configured to perform photoelectric conversion on green light, and
the photoelectric conversion region inside the semiconductor substrate is further configured to perform photoelectric conversion on red light.

9. The solid-state imaging device according to claim 1, wherein the photoelectric conversion region inside the semiconductor substrate corresponds to at least one color.

10. The solid-state imaging device according to claim 9, further comprising a complementary color filter on an incident light side of the photoelectric conversion film.

11. An electronic apparatus, comprising:
a solid-state imaging device that includes:
a photoelectric conversion film above a semiconductor substrate, wherein the photoelectric conversion film is configured to:
perform photoelectric conversion on light having a first wavelength range; and
transmit light having a second wavelength range different from the first wavelength range;
a color filter between the photoelectric conversion film and the semiconductor substrate; and
a photoelectric conversion region inside the semiconductor substrate, wherein
the photoelectric conversion region is configured to perform photoelectric conversion on the light having the second wavelength range,
the light having the second wavelength range passes through the photoelectric conversion film, and
the photoelectric conversion film has an avalanche function.

12. The electronic apparatus according to claim 11, wherein the photoelectric conversion film is an organic film that includes an organic material.

13. The electronic apparatus according to claim 11, wherein the photoelectric conversion film is an inorganic film that includes an inorganic material.

14. The electronic apparatus according to claim 11, wherein the photoelectric conversion film has a function of accumulating charge obtained by the photoelectric conversion on the light having the first wavelength range.

15. The electronic apparatus according to claim 11, wherein
the photoelectric conversion film includes laminated photoelectric conversion films corresponding to two colors, and
each of the photoelectric conversion films corresponding to the two colors includes a film having the avalanche function.

16. The electronic apparatus according to claim 15, wherein each of the photoelectric conversion films corresponding to the two colors is an organic film that includes an organic material.

17. The electronic apparatus according to claim 15, wherein each of the photoelectric conversion films corresponding to the two colors is an inorganic film that includes an inorganic material.

18. The electronic apparatus according to claim 15, wherein
a first photoelectric conversion film of the photoelectric conversion films is on an incident light side of the solid-state imaging device,
the first photoelectric conversion film is configured to perform photoelectric conversion on blue light,
a second photoelectric conversion film of the photoelectric conversion films is on a semiconductor substrate side of the solid-state imaging device,
the second photoelectric conversion film is configured to perform photoelectric conversion on green light, and
the photoelectric conversion region inside the semiconductor substrate is further configured to perform photoelectric conversion on red light.

19. The electronic apparatus according to claim 11, wherein the photoelectric conversion region inside the semiconductor substrate corresponds to at least one color.

20. The electronic apparatus according to claim 19, wherein the solid-state imaging device further includes a complementary color filter on an incident light side of the photoelectric conversion film.

* * * * *